United States Patent
Saito et al.

(10) Patent No.: US 9,455,074 B2
(45) Date of Patent: Sep. 27, 2016

(54) PATTERN FORMING METHOD, DEVICE, AND DEVICE MANUFACTURING METHOD

(71) Applicant: NGK SPARK PLUG CO., LTD., Nagoya-shi, Aichi (JP)

(72) Inventors: Yuri Saito, Komaki (JP); Daisuke Uematsu, Ichinomiya (JP); Nobuhiro Hayakawa, Chita (JP); Ryouma Nakayama, Komaki (JP); Kentarou Mori, Inuyama (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 85 days.

(21) Appl. No.: 14/373,679

(22) PCT Filed: Mar. 28, 2013

(86) PCT No.: PCT/JP2013/002105
§ 371 (c)(1),
(2) Date: Jul. 22, 2014

(87) PCT Pub. No.: WO2013/150747
PCT Pub. Date: Oct. 10, 2013

(65) Prior Publication Data
US 2015/0010738 A1 Jan. 8, 2015

(30) Foreign Application Priority Data
Apr. 4, 2012 (JP) .................................. 2012-085179

(51) Int. Cl.
*B32B 3/02* (2006.01)
*H01B 13/00* (2006.01)
(Continued)

(52) U.S. Cl.
CPC ............ *H01B 13/0026* (2013.01); *H01B 1/02* (2013.01); *H01B 1/22* (2013.01); *H01B 13/30* (2013.01);
(Continued)

(58) Field of Classification Search
CPC ................ H05K 3/125; H05K 3/1283; Y10T 428/24909; Y10T 428/24802; H01B 1/02; H01B 1/22; H01B 13/0026; H01B 13/30; C09D 11/30; C09D 11/322; C09D 11/326; B41M 5/0023; B41M 5/0047
See application file for complete search history.

(56) References Cited

U.S. PATENT DOCUMENTS

2005/0276912 A1* 12/2005 Yamamoto ........ H01L 21/28008
427/117
2006/0292496 A1* 12/2006 Furukawa .............. H05K 3/125
430/311
(Continued)

FOREIGN PATENT DOCUMENTS

JP 59-117293 A 7/1984
JP 5-057873 U 7/1993
(Continued)

OTHER PUBLICATIONS

Communication dated Aug. 26, 2015 issued by the Japanese Patent Office in counterpart Japanese Patent Application No. 2013-550055.
(Continued)

*Primary Examiner* — Elizabeth Mulvaney
(74) *Attorney, Agent, or Firm* — Sughrue Mion, PLLC

(57) ABSTRACT

A pattern forming method which includes ejecting, through a nozzle, a liquid material containing a solvent and metal particles, and depositing droplets of the liquid material onto a pattern formation object, to thereby form a pattern thereon, wherein the viscosity of the liquid material before ejection thereof through the nozzle is lower than that of the liquid material at the time of deposition of droplets thereof onto the pattern formation object.

5 Claims, 4 Drawing Sheets

(51) Int. Cl.
  *H05K 1/09* (2006.01)
  *H05K 3/12* (2006.01)
  *H01B 1/02* (2006.01)
  *H01B 13/30* (2006.01)
  *H01B 1/22* (2006.01)
  *B29C 67/00* (2006.01)

(52) U.S. Cl.
  CPC .............. *H05K 1/092* (2013.01); *H05K 3/125* (2013.01); *H05K 3/1283* (2013.01); *B29C 67/0059* (2013.01); *Y10T 428/24909* (2015.01)

(56) References Cited

U.S. PATENT DOCUMENTS

2008/0122898 A1* 5/2008 Toyoda ...................... B41J 3/28
  347/56
2011/0059230 A1* 3/2011 Hoerteis ................ C09D 11/34
  427/74
2013/0201240 A1* 8/2013 Kodama ................ H05K 3/125
  347/14

FOREIGN PATENT DOCUMENTS

| | | |
|---|---|---|
| JP | 2003-103207 A | 4/2003 |
| JP | 2003-133692 A | 5/2003 |
| JP | 2004-515346 A | 5/2004 |
| JP | 2006-159014 A | 6/2006 |
| JP | 2008-029916 A | 2/2008 |
| JP | 2009-48959 A | 3/2009 |
| JP | 2009-094446 A | 4/2009 |
| JP | 2010-082503 A | 4/2010 |
| JP | 2013-145728 A | 7/2013 |
| WO | 02/45870 A1 | 6/2002 |

OTHER PUBLICATIONS

International Search Report for PCT/JP2013/002105 dated Jun. 11, 2013 [PCT/ISA/210].

* cited by examiner

PATTERN FORMING METHOD, DEVICE, AND DEVICE MANUFACTURING METHOD

CROSS REFERENCE TO RELATED APPLICATIONS

This application is a National Stage of International Application No. PCT/JP2013/002105 filed Mar. 28, 2013, claiming priority based on Japanese Patent Application No. 2012-085179 filed Apr. 4, 2012, the contents of all of which are incorporated herein by reference in their entirety.

TECHNICAL FIELD

The present invention relates to a pattern forming method, to a device, and to a device producing method.

BACKGROUND ART

Hitherto, there has been known a pattern forming method in which a liquid material (ink) prepared through dispersion of metal particles or the like. in a solvent is ejected through a nozzle, and droplets of the liquid material are deposited onto an object on which a pattern is to be formed (hereinafter the object may be referred to as a "pattern formation object"), to thereby form a pattern; such as a conductive pattern or an insulation pattern, on the object. Such a method is a pattern forming method employing an ink-jet system or a dispenser system. As has also been known, such a pattern forming method is employed for formation of, for example, a conductive pattern of a gas sensor.

Meanwhile, for example, there has been known a pattern forming method utilizing an ink-jet printer employing, as a recording liquid, a UV ink exhibiting high viscosity at ambient temperature, in which method a UV ink contained in a recording head is heated to lower the viscosity of the ink, and droplets of the UV ink are deposited onto a pattern formation object, followed by cooling of the object for formation of a pattern (see, for example, Patent Document 1). However, this method relates to a technique unique to a pigment-containing color ink; i.e., a technique regarding suppression of fading of a printed image over a long period of time. That is, this method has no relation to a technique for forming a conductive pattern or the like from a liquid material containing, for example, metal particles.

PRIOR ART DOCUMENT

Patent Document

Patent Document 1: Japanese Patent Application Laid-Open (kokai) No. 2003-145728

SUMMARY OF THE INVENTION

Problems to be Solved by the Invention

Among the aforementioned conventional techniques, the pattern forming method in which a liquid material containing a solvent and metal particles or the like is ejected through a nozzle, and droplets of the liquid material are deposited onto a pattern formation object, to thereby form a pattern thereon may cause a problem unique to an ink containing metal particles; i.e., a problem that, while the solvent contained in the liquid material remains on the pattern formation object after deposition of droplets of the liquid material onto the pattern formation object, the metal particles contained in the liquid material may migrate, and the metal particles may concentrate at a portion where the solvent evaporates preferentially, resulting in non-uniform distribution of the metal particles in the thus-formed pattern.

When a conductive pattern is formed from such a liquid material containing, for example, metal particles, to thereby produce a device, there may arise a problem that the metal particles are non-uniformly distributed in the conductive pattern, resulting in an increase in electric resistance (reduction in electrical conductivity) of the conductive pattern. In order to reduce the electric resistance of the conductive pattern to an intended level, the amount of metal particles (e.g., platinum particles) incorporated into the liquid material must be increased, which may cause a problem of high production cost.

In view of the foregoing, an object of the present invention is to provide a pattern forming method which can form a pattern wherein metal particles are uniformly distributed, and which can reduce production cost. Another object of the present invention is to provide a device including a pattern formed through the method.

Means for Solving the Problems

One mode of the present invention is a pattern forming method comprising ejecting, through a nozzle, a liquid material containing a solvent and metal particles, and depositing droplets of the liquid material onto a pattern formation object, to thereby form a pattern thereon, the pattern forming method comprising a first step of maintaining the liquid material at a first temperature before ejection thereof through the nozzle; a second step of maintaining the pattern formation object at a second temperature lower than the first temperature; a third step of depositing droplets of the liquid material ejected through the nozzle onto the pattern formation object; and a fourth step of promoting evaporation of the solvent contained in the liquid material deposited onto the pattern formation object, wherein the viscosity of the liquid material before ejection thereof through the nozzle before the third step is lower than that of the liquid material at the time of deposition of droplets thereof onto the pattern formation object after the third step, and wherein promotion of evaporation of the solvent in the fourth step is carried out by heating the liquid material.

When, as described above, the liquid material is maintained at the first temperature before ejection thereof through the nozzle in the first step, the pattern formation object is maintained at the second temperature lower than the first temperature in the second step, and droplets of the liquid material ejected through the nozzle are deposited onto the pattern formation object in the third step, the viscosity of the liquid material at the time of ejection thereof through the nozzle before the third step can be maintained lower than that of the liquid material at the time of deposition of droplets thereof onto the pattern formation object after the third step. Thus, while the solvent contained in the liquid material remains on the pattern formation object after deposition of the droplets, migration of the metal particles contained in the liquid material can be suppressed, whereby the metal particles can be uniformly distributed in the thus-formed pattern. In addition, evaporation of the solvent contained in the liquid material deposited onto the pattern formation object is promoted in the fourth step. Therefore, while the solvent contained in the liquid material remains on the pattern formation object after deposition of the droplets, migration of the metal particles contained in the liquid material can be further suppressed, whereby the metal particles can be further uniformly distributed in the thus-formed pattern.

As used herein, the expression "the viscosity of the liquid material at the time of deposition of droplets thereof" refers to the viscosity at the time when the temperature of droplets of the liquid material deposited onto the pattern formation object has become almost equal to that of the pattern formation object (e.g., the difference in temperature between the droplets and the pattern formation object falls within a range of ±1° C. or thereabouts). In this case, the temperature of droplets of the liquid material becomes almost equal to that of the pattern formation object within at most one second (generally, on the order of milliseconds or microseconds) after deposition of the droplets onto the pattern formation object.

In the aforementioned pattern forming method of the present invention, after the third step, the viscosity of the liquid material at the time of deposition of droplets thereof onto the pattern formation object is preferably 25 mPa·s or more.

When, as described above, the viscosity of the liquid material at the time of deposition of droplets thereof is controlled to become 25 mPa·s or more, the liquid material can be ejected through the nozzle effectively at high reproducibility.

In the aforementioned pattern forming method of the present invention, promotion of evaporation of the solvent in the fourth step may be carried out by heating the liquid material. In the aforementioned pattern forming method of the present invention, the liquid material may be ejected through the nozzle by means of an ink-jet system or a dispenser system.

One mode of the present invention is a device comprising a substrate, and a pattern formed on the substrate, the device being characterized in that the pattern on the substrate is formed through the aforementioned pattern forming method. Thus, for example, a favorable conductive pattern exhibiting a specific electrical conductivity can be formed by employing only a small amount of electrically conductive metal particles. That is, a device exhibiting favorable performance can be produced, with production cost being reduced.

One mode of the present invention is a pattern forming method comprising ejecting, through a nozzle, a liquid material containing a solvent and metal particles, and depositing droplets of the liquid material onto a substrate, to thereby form a pattern thereon, the device producing method comprising a first step of maintaining the liquid material at a first temperature before ejection thereof through the nozzle; a second step of maintaining the substrate at a second temperature lower than the first temperature; a third step of depositing droplets of the liquid material ejected through the nozzle onto the substrate; and a fourth step of promoting evaporation of the solvent contained in the liquid material deposited onto the substrate, wherein the viscosity of the liquid material before ejection thereof through the nozzle before the third step is lower than that of the liquid material at the time of deposition of droplets thereof onto the substrate after the third step, and wherein promotion of evaporation of the solvent in the fourth step is carried out by heating the liquid material or reducing the pressure in an atmosphere surrounding the liquid material.

When, as described above, the liquid material is maintained at the first temperature before ejection thereof through the nozzle in the first step, the substrate is maintained at the second temperature lower than the first temperature in the second step, and droplets of the liquid material ejected through the nozzle are deposited onto the substrate in the third step, the viscosity of the liquid material at the time of ejection thereof through the nozzle before the third step can be maintained lower than that of the liquid material at the time of deposition of droplets thereof onto the substrate after the third step. Thus, while the solvent contained in the liquid material remains on the substrate after deposition of the droplets, migration of the metal particles contained in the liquid material can be suppressed, whereby the metal particles can be uniformly distributed in the thus-formed pattern. In addition, evaporation of the solvent contained in the liquid material deposited onto the substrate is promoted in the fourth step. Therefore, while the solvent contained in the liquid material remains on the substrate after deposition of the droplets, migration of the metal particles contained in the liquid material can be further suppressed, whereby the metal particles can be further uniformly distributed in the thus-formed pattern.

In the aforementioned device producing method of the present invention, after the third step, the viscosity of the liquid material at the time of deposition of droplets thereof onto the substrate is preferably 25 mPa·s or more.

When, as described above, the viscosity of the liquid material at the time of deposition of droplets thereof is controlled to become 25 mPa·s or more, the liquid material can be ejected through the nozzle effectively at high reproducibility.

In the aforementioned device producing method of the present invention, promotion of evaporation of the solvent in the fourth step may be carried out by heating the liquid material. In the aforementioned device producing method of the present invention, the liquid material may be ejected through the nozzle by means of an ink-jet system or a dispenser system.

Effects of the Invention

According to the present invention, there can be provided a pattern forming method which can form a pattern wherein metal particles are uniformly distributed, and which can reduce production cost; a device including a pattern formed through the method; and a method for producing the device.

MODES FOR CARRYING OUT THE INVENTION

Embodiments of the present invention will next be described with reference to the drawings.

Figure 1:
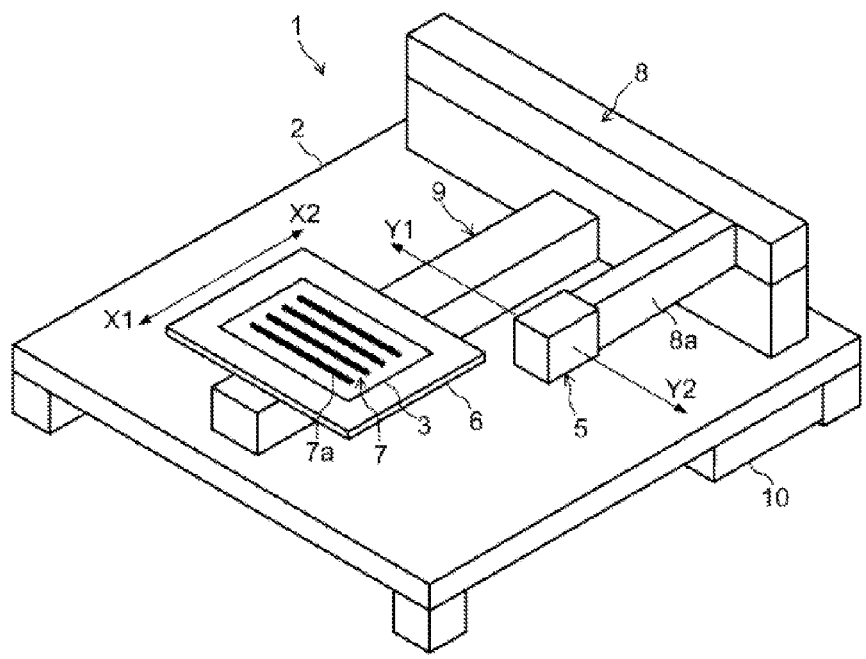
FIG. 1 shows the configuration of a pattern forming apparatus employed in one embodiment of the present invention.

FIG. 1 schematically shows the configuration of a pattern forming apparatus 1 employed in one embodiment of the present invention. As shown in FIG. 1, the pattern forming apparatus 1 is an ink-jet type printing apparatus, and a main portion of the apparatus includes a base 2, a printing head 5, a stage 6, a head moving mechanism 8, a stage moving mechanism 9, and a control unit 10.

The printing head 5 is an ink-jet head in which a plurality of nozzles for ejection of a liquid material are arranged at regular intervals. The individual nozzles are arranged in parallel at a pitch of, for example, 508 μm, and the number of the nozzles is, for example, 128.

The printing head 5 includes, for example, a piezoelectric element. When a voltage is applied to the piezoelectric element, a liquid material (ink) for pattern formation is ejected through the nozzles. The printing head 5 also includes a temperature regulating mechanism (not illustrated) for regulating the temperature of the liquid material before ejection thereof. The liquid material contains a solvent (e.g., butyl carbitol acetate) and, for example, metal particles, metal oxide particles, an alloy, a binder, and a dispersant.

As used herein, the term "metal particles" described in appended claims encompasses "metal particles," "metal oxide particles," and "alloy." However, a metal complex (which is generally called "metal complex pigment") does not correspond to "metal particles" described in appended claims.

The head moving mechanism 8 includes, for example, a drive motor serving as a power source, and a ball screw driven by the drive motor. The head moving mechanism 8 also includes an arm unit 8a which is engaged with the ball screw on the proximal end side, and which supports the printing head 5 on the distal end side. As shown in FIG. 1, the head moving mechanism 8 moves the printing head 5 provided at the distal end of the arm unit 8a in a main scanning direction Y1-Y2.

The respective nozzles of the printing head 5 are arranged at regular pitches in a direction crossing with the main scanning direction Y1-Y2 of the printing head 5.

The stage 6 serves as a substrate holding unit for setting of a substrate 3 (i.e., a pattern formation object) on which a pattern 7 is to be formed. The stage 6 includes a temperature regulating mechanism (not illustrated) for regulating the temperature of the substrate 3.

The substrate 3 is specifically a multi-piece substrate for providing a plurality of rectangular unit substrates (e.g., 48 unit substrates), and is finally divided into individual unit substrates. The substrate 3 (multi-piece substrate) is formed of rectangular unit substrates which are integrally arranged to extend in one direction (in a longitudinal direction). A specific pattern (e.g., a pattern 7 extending in a longitudinal direction) is printed on each unit substrate of the substrate 3 (multi-piece substrate).

The stage moving mechanism 9 includes, for example, a drive motor serving as a power source, and a ball screw driven by the drive motor. The stage moving mechanism 9 moves the stage 6 and the substrate 3 placed thereon in the sub-scanning direction X1-X2 of the printing head 5. Meanwhile, the aforementioned head moving mechanism 8 moves the printing head 5 with respect to the substrate 3 in the longitudinal direction (main scanning direction Y1-Y2) of a conductive pattern 7 which is to be formed on the surface of the substrate 3 placed on the stage 6.

The control unit 10 supplies a control signal (voltage) to the piezoelectric element of the printing head 5 for ejecting the liquid material through the nozzles. As shown in FIG. 1, the control unit 10 supplies a drive signal to the drive motor of the head moving mechanism 8 for moving the printing head 5 in the main scanning direction Y1-Y2. Also, the control unit 10 supplies a drive signal to the drive motor of the stage moving mechanism 9 for moving the stage 6 in the sub-scanning direction X1-X2 of the printing head 5.

In the present embodiment, a pattern is formed in the following manner by means of the pattern forming apparatus 1 having the aforementioned configuration.

Specifically, a pattern is formed by controlling the viscosity of the liquid material so that the viscosity before ejection of the liquid material through the nozzles of the printing head 5 becomes lower than that at the time of deposition of droplets of the liquid material onto the substrate 3 (i.e., pattern formation object), and so that the viscosity at the time of deposition of the droplets onto the substrate 3 becomes 25 mPa·s or more.

When the viscosity of the liquid material is controlled as described above, metal particles can be uniformly distributed in the thus-formed pattern. Therefore, when, for example, a conductive pattern is formed from a liquid material containing electrically conductive metal particles, an increase in electric resistance of the thus-formed conductive pattern can be suppressed, and the amount of metal particles (e.g., platinum particles) incorporated into the liquid material can be reduced. Also, the thickness of the conductive pattern can be reduced in association with a reduction in the amount of metal particles employed.

As used herein, "the viscosity of the liquid material at the time of deposition of droplets thereof" onto the substrate 3 refers to the viscosity at the time when the temperature of droplets of the liquid material deposited onto the substrate 3 becomes almost equal to that of the substrate 3 (e.g., the difference in temperature between the droplets and the substrate 3 falls within a range of ±1° C. or thereabouts). In this case, the temperature of droplets of the liquid material becomes almost equal to that of the substrate 3 within at most one second (generally, on the order of milliseconds or microseconds) after deposition of the droplets onto the substrate 3.

The reason why the viscosity of the liquid material before ejection thereof through the nozzles of the printing head 5 is controlled to become lower than the viscosity thereof at the time of deposition of the droplets (25 mPa·s or more) is that the viscosity of the liquid material ejection through the nozzles of the printing head 5 must be maintained at about 20 mPa·s for reproducible and reliable ejection of the liquid material through the nozzles. For this reason, in the present embodiment, the viscosity of the liquid material before ejection thereof through the nozzles of the printing head 5 is maintained lower than that at the time of deposition of liquid material droplets; for example, the viscosity is maintained at about 15 to about 20 mPa·s. This viscosity control for the liquid material in the printing head 5 can be carried out by maintaining the temperature of the liquid material at, for example, about 40° C.

Figure 2:
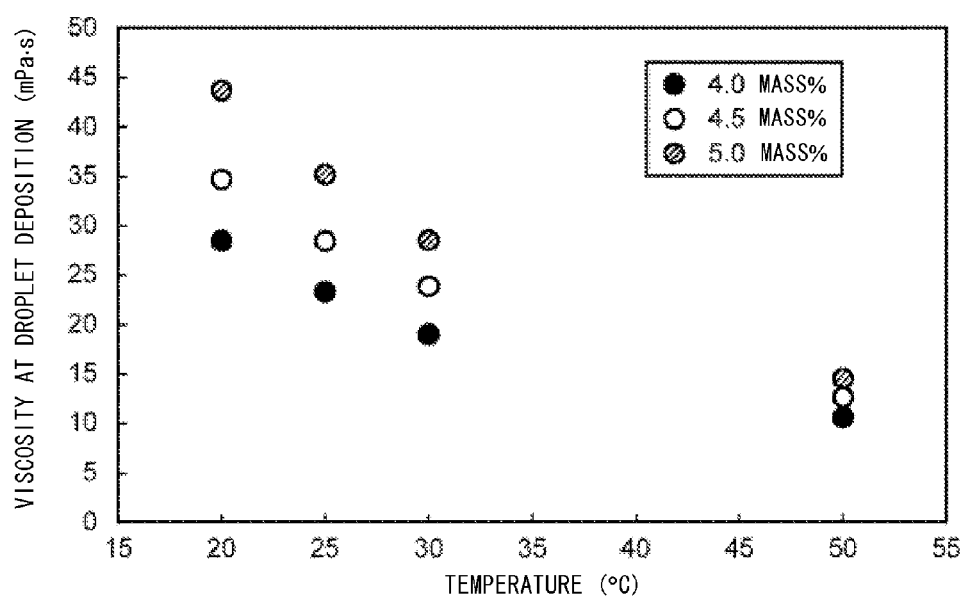
FIG. 2 is a graph showing the relationship between temperature and viscosity at the time of deposition of droplets.

FIG. 2 is a graph showing the relationship between the temperature and viscosity of a liquid material (vertical axis: viscosity at the time of deposition of droplets, horizontal axis: temperature). The graph of FIG. 2 shows the case where the organic binder content of the liquid material is 4.0 (mass %), 4.5 (mass %), or 5.0 (mass %). The viscosity was measured by means of a digital viscometer (model: LVDV-2+Pro, product of Brookfield, USA, spindle employed: SC4-18, measuring conditions: rotation speed of 150 rpm or less, and maximum torque).

As shown in the graph of FIG. 2, the higher the temperature of the liquid material, the lower the viscosity thereof, whereas the lower the temperature of the liquid material, the higher the viscosity thereof. Meanwhile, the higher the organic binder content of the liquid material, the higher the viscosity thereof, whereas the lower the organic binder content of the liquid material, the lower the viscosity thereof. Thus, the viscosity of the liquid material can be controlled by varying the temperature and/or organic binder content of the liquid material.

In the present embodiment, generally, the viscosity of the liquid material is controlled by regulating the temperature of the liquid material before ejection thereof through the nozzles of the printing head 5 of the pattern forming apparatus 1, or regulating the temperature of the stage 6 on which the substrate 3 is placed. In this case, specifically, the viscosity of the liquid material is controlled by carrying out the following steps: a first step of maintaining the liquid material before ejection thereof through the nozzles of the printing head 5 at a first temperature (e.g., 40° C.); a second step of maintaining the substrate 3 (i.e., pattern formation object) at a second temperature (e.g., 20 to 25° C.) lower than the first temperature; and a third step of depositing droplets of the liquid material ejected through the nozzles of the printing head 5 onto the substrate 3 (i.e., pattern formation object). Thus, migration of the metal particles contained in the liquid material can be suppressed while the solvent contained in the liquid material remains on the substrate after deposition of the droplets, whereby the metal particles can be uniformly distributed in the thus-formed pattern.

In the present embodiment, after the third step, there is optionally carried out a fourth step of promoting evaporation of the solvent contained in the liquid material deposited onto the substrate 3 (i.e., pattern formation object). When the fourth step is performed, migration of the metal particles can be further suppressed, and the metal particles can be further uniformly distributed in the thus-formed pattern. Promotion of evaporation of the solvent in the fourth step can be carried out by, for example, heating the liquid material droplets deposited onto the substrate 3 through regulation of the temperature of the stage 6 on which the substrate 3 is placed, or reducing the pressure in an atmosphere surrounding the liquid material by means of a pressure-reducing apparatus such as a vacuum pump.

Next will be described Examples and Comparative Examples in which patterns were formed by means of the pattern forming apparatus 1 shown in FIG. 1.

Patterns were formed by means of the pattern forming apparatus 1 shown in FIG. 1 by varying the temperature of the stage 6 (organic binder content: 4.0 (mass %), 4.5 (mass %), and 5.0 (mass %)), and the appearance (after firing) of each of the thus-formed patterns was observed under an SEM. The temperature of the liquid material before ejection thereof through the nozzles of the printing head 5 was maintained at 40° C. In this case, the viscosity of the liquid material before ejection thereof through the nozzles of the printing head 5 was 20.0 mPa·s or less.

In the case where the binder content was 5.0 (mass %), a dense pattern with a small number of voids was found to be formed when the temperature of the stage 6 was 20° C. (viscosity at the time of droplet deposition: 43.6 mPa·s), when the temperature of the stage 6 was 25° C. (viscosity at the time of droplet deposition: 35.2 mPa·s), or when the temperature of the stage 6 was 30° C. (viscosity at the time of droplet deposition: 28.7 mPa·s).

In contrast, when the temperature of the stage 6 was 50° C. (viscosity at the time of droplet deposition: 14.4 mPa·s), a non-dense pattern with a large number of voids was formed. That is, the aforementioned data indicate that when the viscosity of the liquid material before ejection thereof through the nozzles is lower than that at the time of deposition of droplets of the liquid material onto the substrate 3, a dense pattern with a small number of voids is formed.

The results are shown in Table 1 (including viscosity at the time of droplet deposition), wherein "O" corresponds to formation of a dense pattern as determined by appearance observation, and "X" corresponds to formation of a non-dense pattern with a large number of voids.

TABLE 1

| Organic binder content (mass %) Stage temperature (° C.) | 4.0 | 4.5 | 5.0 |
|---|---|---|---|
| 50 | X 10.8 mPa·s | X 12.8 mPa·s | X 14.4 mPa·s |
| 30 | X 19.2 mPa·s | X 23.9 mPa·s | X 28.7 mPa·s |
| 25 | O 25.1 mPa·s | O 28.6 mPa·s | O 35.2 mPa·s |
| 20 | O 28.6 mPa·s | O 34.7 mPa·s | O 43.6 mPa·s |

As shown in Table 1, a dense pattern was formed by controlling the viscosity of the liquid material at the time of deposition of droplets thereof to be 25 mPa·s or more. The reason for this is considered as follow. Since the viscosity of the liquid material at the time of deposition of droplets thereof is relatively high, the liquid material can be ejected through the nozzles effectively at high reproducibility, and migration of the metal particles contained in the liquid material can be suppressed while the solvent contained in the liquid material remains on the substrate. As shown in Table 1, when the organic binder content is 4.0 (mass %) or 4.5 (mass %), the case where the stage temperature is 20° C. or 25° C. corresponds to Example, whereas the case where the stage temperature is 30° C. or 50° C. corresponds to Comparative Example. Meanwhile, when the organic binder content is 5.0 (mass %), the case where the stage temperature is 20° C., 25° C., or 30° C. corresponds to Example, whereas the case where the stage temperature is 50° C. corresponds to Comparative Example.

Figure 3:
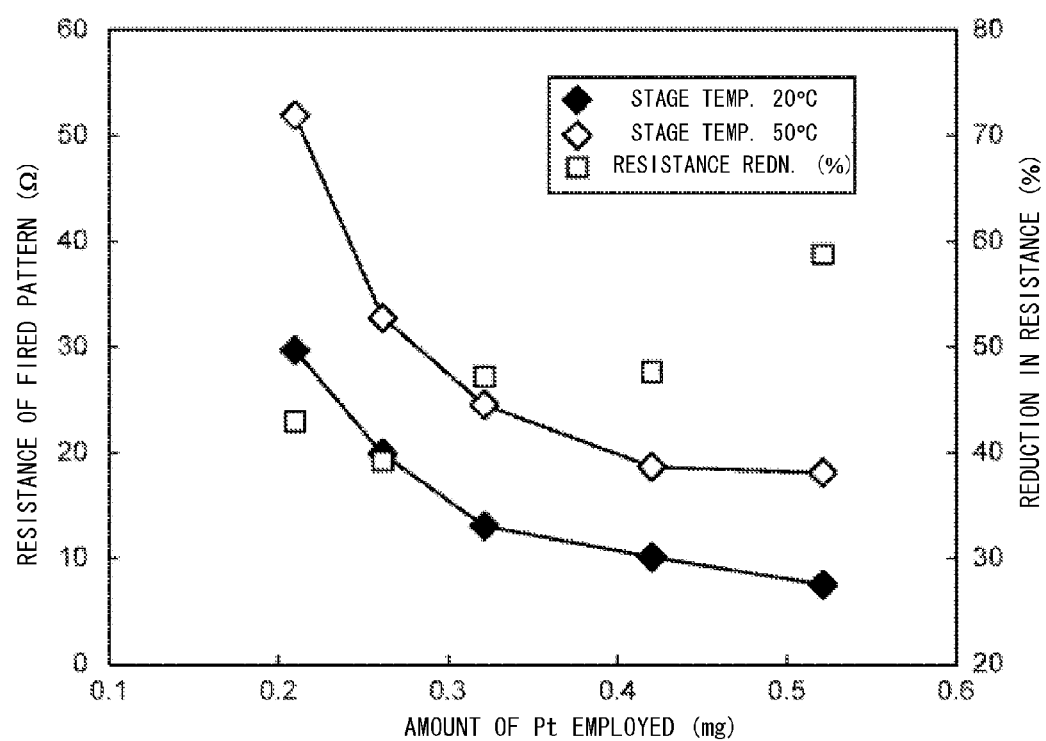
FIG. 3 is a graph showing the relationship between the resistance of a fired pattern and the amount of metal powder employed.

FIG. 3 is a graph showing the results of an experiment in which a conductive pattern was formed from a liquid material containing platinum powder by means of the pattern forming apparatus 1 shown in FIG. 1, and the resistance of the conductive pattern was measured after firing thereof. In the graph of FIG. 3, the vertical axis corresponds to the resistance ($\Omega$) of the fired pattern and the percent reduction in resistance (%), whereas the horizontal axis corresponds to the amount of platinum powder (mg). In the graph of FIG. 3, the data plotted by black rhombic marks correspond to the case where the temperature of the stage 6 is 20° C. (Example), and the data plotted by white rhombic marks correspond to the case where the temperature of the stage 6 is 50° C. (Comparative Example). In the graph of FIG. 3, the data plotted by white square marks correspond to the percent reduction in resistance in the case where the temperature of the stage 6 is 20° C. (Example) with respect to the case where the temperature of the stage 6 is 50° C. (Comparative Example).

As shown in the graph of FIG. 3, even when the amount of platinum powder contained in the liquid material was the same, in the case where the temperature of the stage 6 was 20° C. (Example, viscosity of the liquid material at the time of droplet deposition: 34.7 mPa·s), the resistance was reduced by 39% or more, as compared with the case where the temperature of the stage 6 was 50° C. (Comparative Example, viscosity of the liquid material at the time of droplet deposition: 12.8 mPa·s).

When, for example, the target resistance of the conductive pattern is set at 20Ω, in the case where the temperature of the stage 6 is adjusted to 20° C. (viscosity of the liquid material at the time of droplet deposition: 34.7 mPa·s), the amount of platinum powder incorporated into the liquid material can be reduced by about 39%, as compared with the case where the temperature of the stage 6 is adjusted to 50° C. (viscosity of the liquid material at the time of droplet deposition: 12.8 mPa·s).

The viscosity of the aforementioned liquid material varies with, for example, the amounts or proportions of metal powder and metal oxide powder contained in the liquid material. Therefore, patterns were formed from liquid materials containing metal powder and metal oxide powder in different proportions by volume (4:1, 1:1, and 0:1), and the appearance (after firing) of each of the thus-formed patterns was observed under an SEM. The results are shown in Table 2 (including viscosity at the time of droplet deposition), wherein "O" corresponds to formation of a dense pattern, and "X" corresponds to formation of a non-dense pattern with a large number of voids.

TABLE 2

| Metal:metal oxide (proportions by volume) Stage temperature (° C.) | 4:1 | 1:1 | 0:1 |
| --- | --- | --- | --- |
| 50 | X 10.8 mPa · s | — | — |
| 30 | X 19.2 mPa · s | — | O 25.8 mPa · s |
| 25 | O 25.1 mPa · s | O 26.3 mPa · s | O 30.1 mPa · s |
| 20 | O 28.6 mPa · s | — | O 35.2 mPa · s |

As shown in Table 2, even when the temperature of the stage 6 of the pattern forming apparatus 1 is the same, the viscosity of the liquid material at the time of droplet deposition varies with the proportions of metal powder and metal oxide powder. Also in such a case, when the viscosity of the liquid material at the time of droplet deposition is controlled to be 25 mPa·s or more, a dense pattern can be formed through firing. In Table 2, cells having no data (viscosity and "O" or "X") correspond to the case where no experiment was carried out. In Table 2, the case where the proportions by volume of metal powder and metal oxide powder are 0:1 corresponds to, for example, formation of an insulation pattern from alumina serving as metal oxide powder.

As shown in Table 2, when the proportions by volume of metal powder and metal oxide powder contained in the liquid material are 4:1, the case where the stage temperature is 20° C. or 25° C. corresponds to Example, whereas the case where the stage temperature is 30° C. or 50° C. corresponds to Comparative Example. Meanwhile, each of the cases where the proportions by volume of metal powder and metal oxide powder contained in the liquid material are 1:1 and 0:1 corresponds to Example.

When, as described above, the viscosity of the liquid material at the time of droplet deposition is controlled to be 25 mPa·s or more, a dense pattern can be formed through firing, and the metal particles can be uniformly distributed in the thus-formed pattern. Thus, when a pattern is formed from a liquid material containing metal powder, an increase in electric resistance can be suppressed in the thus-formed pattern, and the amount of metal powder incorporated into the liquid material can be reduced. Also, since a dense pattern can be formed while the amount of metal powder employed is reduced, the thickness of the pattern can be reduced.

Figure 4:
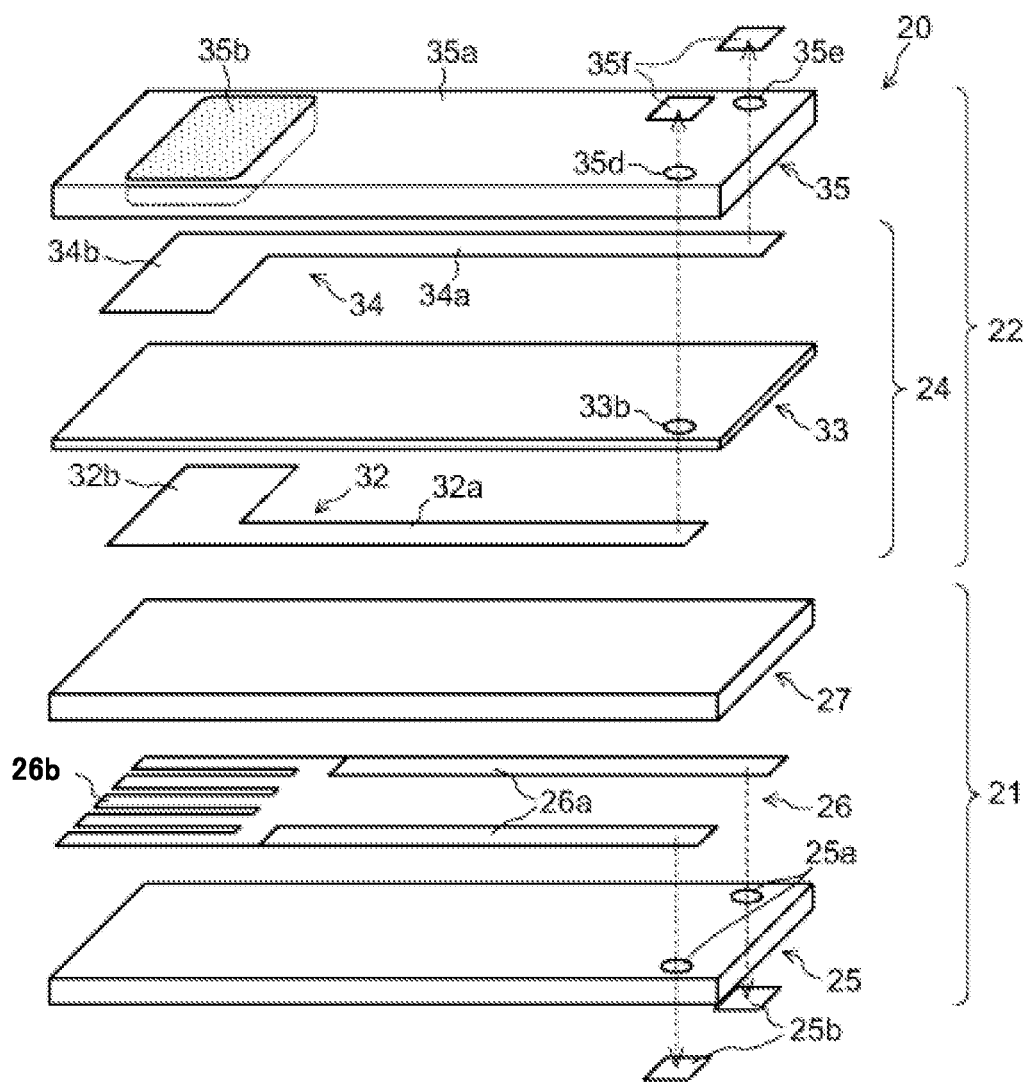
FIG. 4 shows the configuration of a gas sensor element according to an embodiment of the present invention.

Next will be described, with reference to FIG. 4, a gas sensor element which is an example of a device including a pattern formed through the pattern forming method or device producing method according to the present embodiment. As shown in FIG. 4, the gas sensor element 20 includes a gas sensor element main body 22 and a heater 21 which are stacked with each other.

The heater 21 includes a first substrate 27, a second substrate 25, and a resistance heat-generating element 26. The resistance heat-generating element 26 predominantly contains, for example, platinum or tungsten, and each of the first substrate 27 and the second substrate 25 is formed of a ceramic sintered compact predominantly containing aluminum oxide (alumina) or the like. The resistance heat-generating element 26 is sandwiched between the rectangular first substrate 27 and the rectangular second substrate 25.

The resistance heat-generating element 26 includes a serpentine-shaped heat-generating portion 26b which generates heat through application of electricity, and a pair of heater lead portions 26a extending in the longitudinal direction of the first substrate 27 and the second substrate 25, wherein one end of each heater lead portion 26a is connected to the heat-generating portion 26b. The other ends of the paired heater lead portions 26a are respectively connected, via two through holes 25a penetrating the second substrate 25, to a pair of heater electrical conduction terminals 25b which are connected to external terminals for external circuit connection.

The gas sensor element main body 22 includes an oxygen concentration determination cell (oxygen concentration determination cell substrate) 24 and a protective layer 35. The oxygen concentration determination cell 24 includes a rectangular solid electrolyte substrate 33, a first electrode pattern 32, and a second electrode pattern 34. The solid electrolyte substrate 33 serves as a solid electrolyte body for an oxygen concentration cell.

A first electrode pattern 32 and a second electrode pattern 34 are formed, through ink-jet printing, on opposite main surfaces of the solid electrolyte substrate 33 by the pattern forming method of the present embodiment, such that the electrode patterns 32 and 34 extend in a longitudinal direction (in the longitudinal direction of the below-described first electrode lead portion 32a and second electrode lead portion 34a). The first electrode pattern 32 and the second electrode pattern 34 are respectively provided with a first electrode portion 32b and a second electrode portion 34b, the portions 32b and 34b facing each other via the solid electrolyte substrate 33, and forming a detection unit (not illustrated) together with the solid electrolyte substrate 33.

The first electrode pattern 32 has a first electrode lead portion 32a extending from the first electrode portion 32b in the longitudinal direction of the solid electrolyte substrate 33. Meanwhile, the second electrode pattern 34 has a second electrode lead portion 34a extending from the second electrode portion 34b in the longitudinal direction of the solid electrolyte substrate 33. The protective layer 35 is provided such that the second electrode pattern 34 is sandwiched between the protective layer 35 and the solid electrolyte substrate 33. The protective layer 35 includes a porous electrode protective layer 35b for protection of the second electrode portion 34b from poisoning, and a reinforced protective layer 35a for protection of the solid electrolyte substrate 33.

The end of the first electrode lead portion 32a is connected to one of signal extracting terminals 35f via a through hole 33b provided in the solid electrolyte substrate 33 and a through hole 35d provided in the protective layer 35. Meanwhile, the end of the second electrode lead portion 34a is connected to the other signal extracting terminal 35f via a through hole 35e provided in the protective layer 35. The gas sensor element 20 having the aforementioned configuration can measure an oxygen concentration by the concentration cell effect of the oxygen concentration determination cell 24, and can also be employed as, for example, an air-fuel ratio sensor.

Each of the first electrode pattern 32 and second electrode pattern 34 is formed through the aforementioned pattern forming method from a liquid material (ink) containing butyl carbitol acetate serving as a solvent and, for example, a metal, a metal oxide, a binder, and a dispersant. In the gas sensor element 20 having the aforementioned configuration, the first electrode pattern 32 and the second electrode pattern 34 are formed, through the aforementioned pattern forming method, on the solid electrolyte substrate 33 of the oxygen concentration determination cell 24. Therefore, internal electrical connection reliability can be improved, and production cost can be reduced.

Figure 5:
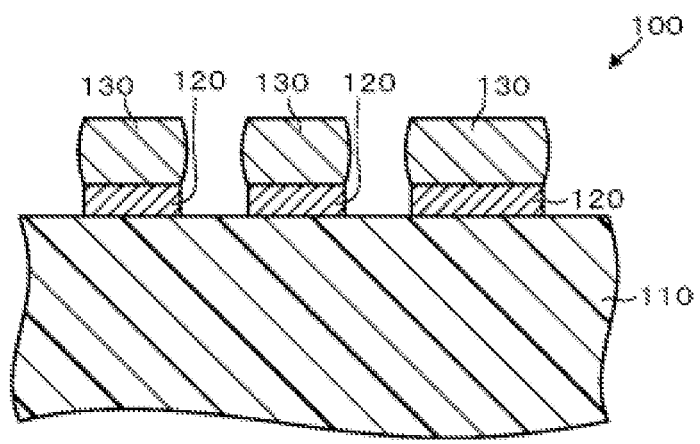
FIG. 5 shows the configuration of a semiconductor device according to an embodiment of the present invention.

Next will be described, with reference to FIG. 5, a semiconductor device including a substrate and a semiconductor element mounted thereon, which semiconductor device is an example of a device including a pattern formed through the pattern forming method according to the present embodiment, and is, for example, a flip-chip package, a chip scale package, a multi-chip package, an antenna switch module, a mixer module, a PLL module, or a multi-chip module.

In this embodiment, by means of the pattern forming apparatus shown in FIG. 1, a conductive pattern having a thickness of 0.5 μm (lower conductive pattern 120) is formed, through the aforementioned pattern forming method, on a substrate 110 (made of ceramic material, etc.) from a liquid material (ink) containing butyl carbitol acetate serving as a solvent and, for example, silver particles (i.e., metal), a binder, and a dispersant.

Subsequently, a dispersion containing a Pd catalyst component is charged into the pattern forming apparatus, and the Pd catalyst component is deposited on the lower conductive pattern 120 through printing. Next, an upper conductive pattern 130 having a thickness of 25 μm is formed on the lower conductive pattern 120 through electroless copper plating.

Thereafter, an electronic component such as a semiconductor element (not illustrated) is mounted on the substrate 110, and is electrically connected to the aforementioned conductive pattern including the lower conductive pattern 120 and the upper conductive pattern 130, to thereby produce a wiring substrate 100. Then, packaging or a like process is carried out, to thereby produce a semiconductor device.

Also in the semiconductor device having the aforementioned configuration, electrical connection reliability can be improved, and production cost can be reduced.

While the present invention has been described in detail with reference to the embodiments and Examples, the invention is not limited thereto. That is, various modifications may be made without departing from the scope of the present invention. For example, in the above-described embodiments, an ink-jet system is employed. However, the present invention is not limited thereto, and may be applied to the case where a dispenser system is employed.

DESCRIPTION OF REFERENCE NUMERALS

1: pattern forming apparatus
2: base
3: substrate
5: printing head
6: stage
7: pattern
8: head moving mechanism
9: stage moving mechanism
10: control unit

The invention claimed is:

1. A pattern forming method comprising ejecting, through a nozzle, a liquid material containing a solvent and metal particles, and depositing droplets of the liquid material onto a pattern formation object, to thereby form a pattern thereon, the pattern forming method comprising:
   a first step of maintaining the liquid material at a first temperature before ejection thereof through the nozzle;
   a second step of maintaining the pattern formation object at a second temperature lower than the first temperature;
   a third step of depositing droplets of the liquid material ejected through the nozzle onto the pattern formation object; and
   a fourth step of promoting evaporation of the solvent contained in the liquid material deposited onto the pattern formation object, wherein:
   the viscosity of the liquid material before ejection thereof through the nozzle before the third step is lower than that of the liquid material at the time of deposition of droplets thereof onto the pattern formation object after the third step;
   wherein promotion of evaporation of the solvent in the fourth step is carried out by heating the liquid material; and
   wherein, after the third step, the viscosity of the liquid material at the time of deposition of droplets thereof onto the pattern formation object is 25 mPa·s or more.

2. A pattern forming method according to claim 1, wherein the liquid material is ejected by means of an ink-jet system or a dispenser system.

3. A device comprising a substrate, and a pattern formed on the substrate, the device being characterized in that:
   the pattern on the substrate is formed through a pattern forming method as recited in claim 1.

4. A device producing method comprising ejecting, through a nozzle, a liquid material containing a solvent and metal particles, and depositing droplets of the liquid material onto a substrate, to thereby form a pattern thereon, the device producing method comprising:
   a first step of maintaining the liquid material at a first temperature before ejection thereof through the nozzle;
   a second step of maintaining the substrate at a second temperature lower than the first temperature;
   a third step of depositing droplets of the liquid material ejected through the nozzle onto the substrate; and
   a fourth step of promoting evaporation of the solvent contained in the liquid material deposited onto the substrate, wherein:
   the viscosity of the liquid material before ejection thereof through the nozzle before the third step is lower than that of the liquid material at the time of deposition of droplets thereof onto the substrate after the third step;
   wherein promotion of evaporation of the solvent in the fourth step is carried out by heating the liquid material; and
   wherein, after the third step, the viscosity of the liquid material at the time of deposition of droplets thereof onto the substrate is 25 mPa·s or more.

5. A device producing method according to claim 4, wherein the liquid material is ejected by means of an ink-jet system or a dispenser system.

* * * * *